United States Patent [19]

Walther et al.

[11] Patent Number: 5,335,201

[45] Date of Patent: * Aug. 2, 1994

[54] METHOD FOR PROVIDING SYNCHRONOUS REFRESH CYCLES IN SELF-REFRESHING INTERRUPTABLE DRAMS

[75] Inventors: Terry R. Walther; Scott E. Schaefer, both of Boise, Id.

[73] Assignee: Micron Technology, Inc., Boise, Id.

[*] Notice: The portion of the term of this patent subsequent to Jul. 20, 2010 has been disclaimed.

[21] Appl. No.: 685,330

[22] Filed: Apr. 15, 1991

[51] Int. Cl.$^5$ .............................................. G11C 7/00
[52] U.S. Cl. ..................... 365/222; 365/233
[58] Field of Search ................. 365/222, 233, 228

[56] References Cited

U.S. PATENT DOCUMENTS

| | | |
|---|---|---|
| 3,800,295 | 3/1974 | Anderson, Jr. .................... 365/222 |
| 4,172,282 | 10/1979 | Aichelmann, Jr. et al. .... 365/222 X |
| 4,238,842 | 12/1980 | Aichelmann, Jr. et al. ........ 365/222 |
| 4,468,759 | 8/1984 | Kung et al. ..................... 365/222 X |
| 4,827,453 | 5/1989 | Sawada et al. ...................... 365/222 |
| 5,229,969 | 7/1993 | Lee et al. ............................ 365/222 |
| 5,229,970 | 7/1993 | Lee et al. ............................ 365/222 |

OTHER PUBLICATIONS

Herrman et al., "Synchronization of Refresh Address . . . system", IBM Tech. Discl. Bulletin, vol. 27, No. 9, Feb. 1985, pp. 5310-5312.

Primary Examiner—Seungsook Ham
Attorney, Agent, or Firm—Susan B. Collier

[57] ABSTRACT

The invention is a method for synchronizing the refresh cycles of a bank of self-refreshing interruptable DRAMs. The refresh cycles are synchronized through a bidirectional control path from each self-refreshing interruptable DRAM to its respective external refresh pin.

43 Claims, 8 Drawing Sheets

METHOD FOR PROVIDING SYNCHRONOUS REFRESH CYCLES IN SELF-REFRESHING INTERRUPTABLE DRAMS

FIELD OF THE INVENTION

The invention relates to self-refreshing interruptable dynamic random access memories (DRAMs) having control and clock generator functions fabricated on each individual chip. The control and system clock functions determine refresh cycles.

BACKGROUND OF THE INVENTION

A self-refreshing DRAM is a dynamic random access memory which has an autonomous refresh circuit, and multiplexed addressing of RAS and CAS signals which corresponds to that of a dynamic random access memory. A pseudo static random access memory (SRAM) is a self-refreshing DRAM having nonmultiplexed addressing. A self-refreshing interruptable DRAM is a self-refreshing DRAM with an output pin which applies a wait signal to the microprocessor while the refresh on the DRAM is occurring.

DRAMs are composed of a plurality of memory cells in which each cell consists of a transistor network and an intrinsic capacitor. The transistors are used to charge and discharge the capacitors to certain voltage levels. The capacitors then store the voltages as binary bits, 1 or 0, representative of the voltage levels. The binary 1 is referred to as a "high" and the binary 0 is referred to as a "low." The voltage value of the information stored in the capacitor of a memory cell is called the logic state of the memory cell. Due to parasitic capacitance leakage, the memory cells must be refreshed periodically to keep the capacitors charged or discharged and to ensure the memory preservation. A refresh cycle normally involves cycling through the memory and performing a read/write operation in each location of the memory in turn during a power down mode. The power down mode is typically characterized as a low power mode having no active read or write operations. One common method of refreshing DRAMs is by a row refresh approach. It is necessary to refresh each row of memory in the DRAM device within a time period of 7 to 125 microseconds. In order to accomplish this there are two basic approaches which can be used. One is to stop the processor from executing the current program and refresh all rows of memory sequentially. This is classified as a burst operation. Another approach is to interrupt the microprocessor every 7 to 125 microseconds and have it jump to a routine which would execute enough contiguous instructions to accomplish the memory refresh, according to externally applied address signals $A_0$–$A_n$ or internally applied address signals $Q_0$–$Q_n$ generated by a refresh counter internal to the refresh circuit. This is classified as a distribution operation. The timing sequence of the refresh circuit is the period of time between the initiation of a refresh cycle and the initiation of the next refresh cycle.

The refresh timing sequence for a DRAM is regulated by a DRAM controller in response to RAS and CAS signals applied thereto through a clock generator. The DRAM controller and clock generator are external to the individual DRAMs in the bank. Where there are other devices on the line with the memory system in which said devices may interrupt the normal processing operation, or where there is a power down of the memory system, it is necessary that the DRAM device be refreshed during the power down. Where a peripheral device has access to the DRAM memory at the same time that an intentional refresh operation is required to occur, the DRAM controller circuits will interrupt the memory access to allow the refresh operation to occur. Such an interruption degrades the potential system throughput by as much as ten percent.

In a more recent design the DRAM controller circuitry and refresh clock have been incorporated internally on each individual DRAM, regulating the refresh cycle pertinent to the particular DRAM upon which it is fabricated. This eliminates the need for an external DRAM controller and/or clock since each DRAM has its own DRAM controller and refresh clock. This configuration is referred to as a self-refreshing DRAM. Since self-refreshing DRAMs encompass pseudo SRAMs, the more inclusive term, self-refreshing DRAMs, will be used to refer to both self-refreshing DRAMs and pseudo SRAMs. The self-refreshing interruptable DRAM utilizes the same DRAM controller and refresh clock configuration as the self-refreshing DRAM. In some applications both an external clock and controller and an internal clock and controller are employed.

Since the memory system is powered down during refresh, a problem arises with the implementation of internal DRAM controllers and refresh clocks. Since the normal operation of the entire memory must be shut down during the refresh of each self-refreshing interruptable DRAM and since the individual refresh cycles are not synchronized, each self-refreshing interruptable DRAM in the system can potentially shut down the normal operation for an additional period of time equal to the time of the refresh cycle. Each nonsynchronous refresh cycle causes additional wait states. For example, if there are 20 self-refreshing interruptable DRAMs in a bank, the normal processor operation may be shut down a maximum of 20 times for a given refresh cycle if each self-refreshing interruptable DRAM refreshes at a different time than the others. Thus, using self-refreshing interruptable DRAMs can negatively affect the processing speed of the processor.

Additionally, the power requirements are greater with a plurality of self-refreshing DPAMs and self-refreshing interruptable DRAMs and their inherent plurality of DRAM controllers and refresh clock generators. Even in a nondistributed refresh operation, significant power is dissipated in the DRAM controller chip and its associated high-speed system clock driver circuitry.

SUMMARY OF THE INVENTION

The invention synchronizes the refresh cycles of a bank of self-refreshing interruptable DRAMs. Each self-refreshing interruptable DRAM has the capability to interact with similar self-refreshing interruptable DRAMs in the bank. Each self-refreshing interruptable DRAM has an external refresh pin. The external refresh pins are connected at a common node in a wired AND configuration. The refresh cycles are synchronized when a low on one refresh pin pulls the remaining refresh pins low. The low on the refresh pin either signals the microprocessor to wait or the external peripherals to shut down.

One advantage is the reduction of microprocessor wait states. Since the refresh cycles are synchronized, the processor is only interrupted once per row refreshed. This results in a significant process time savings and power savings.

BRIEF DESCRIPTION OF THE DRAWINGS

FIG. 6 shows the arbitration circuit; FIG. 7 shows the start/-stop circuit; and FIG. 8 shows the timing circuit.

DETAILED DESCRIPTION OF THE PREFERRED EMBODIMENTS

In order for a self-refreshing DRAM to retain the cell information, the self-refreshing DRAM self-refresh logic on all self-refreshing DRAMs in a bank of self-refreshing DRAMs is enabled through an arbitration circuit during a low-power "power down mode." An oscillator and timer are included on the self-refreshing DRAM to determine a timing sequence for a periodic refresh rate of the self-refreshing DRAM after the initial refresh enable. The self-refreshing DRAM refreshes the current row and increments the row address for the next refresh for each timing sequence. The row address counter and logic are already included on standard DRAMs. In a first embodiment of the invention the refresh cycles of the self-refreshing interruptable DRAMs in the bank are synchronized by connecting each external refresh pin in a wired AND configuration to the other external refresh pins of the bank. The refresh pins are passively pulled to a high state through an external resistor and any self-refreshing interruptable DRAM driving its refresh pin low will cause all the self-refreshing interruptable DRAMs refresh pins to be asserted low. The internal timing sequence or the external refresh pin asserted low causes the self-refreshing interruptable DRAM to refresh the current row and simultaneously signals the microprocessor to wait.

In a second embodiment of the invention the refresh pins of the bank of self-refreshing DRAMs remain connected in a wired AND configuration. A reset pulse synchronizes the oscillators and timers of all the self-refreshing DRAMs to the same state. Thus, the self-refreshing DRAMs start timing from a common time reference. During the first refresh cycle after the power down mode initiation all synchronous oscillators and timers are running concurrently. The self-refreshing DRAM having the fastest oscillator and timer in the system is the master self-refreshing DRAM for the remainder of the power down mode. The remaining self-refreshing DRAMs are slave self-refreshing DRAMs. The synchronous oscillator and timer of the master self-refreshing DRAM continue to perform an internal refresh and assert the external refresh pin low periodically. The synchronous oscillators and timers in the slave self-refreshing DRAMs are disabled and only the external refresh pin asserted low will cause the row refresh.

Figure 1:
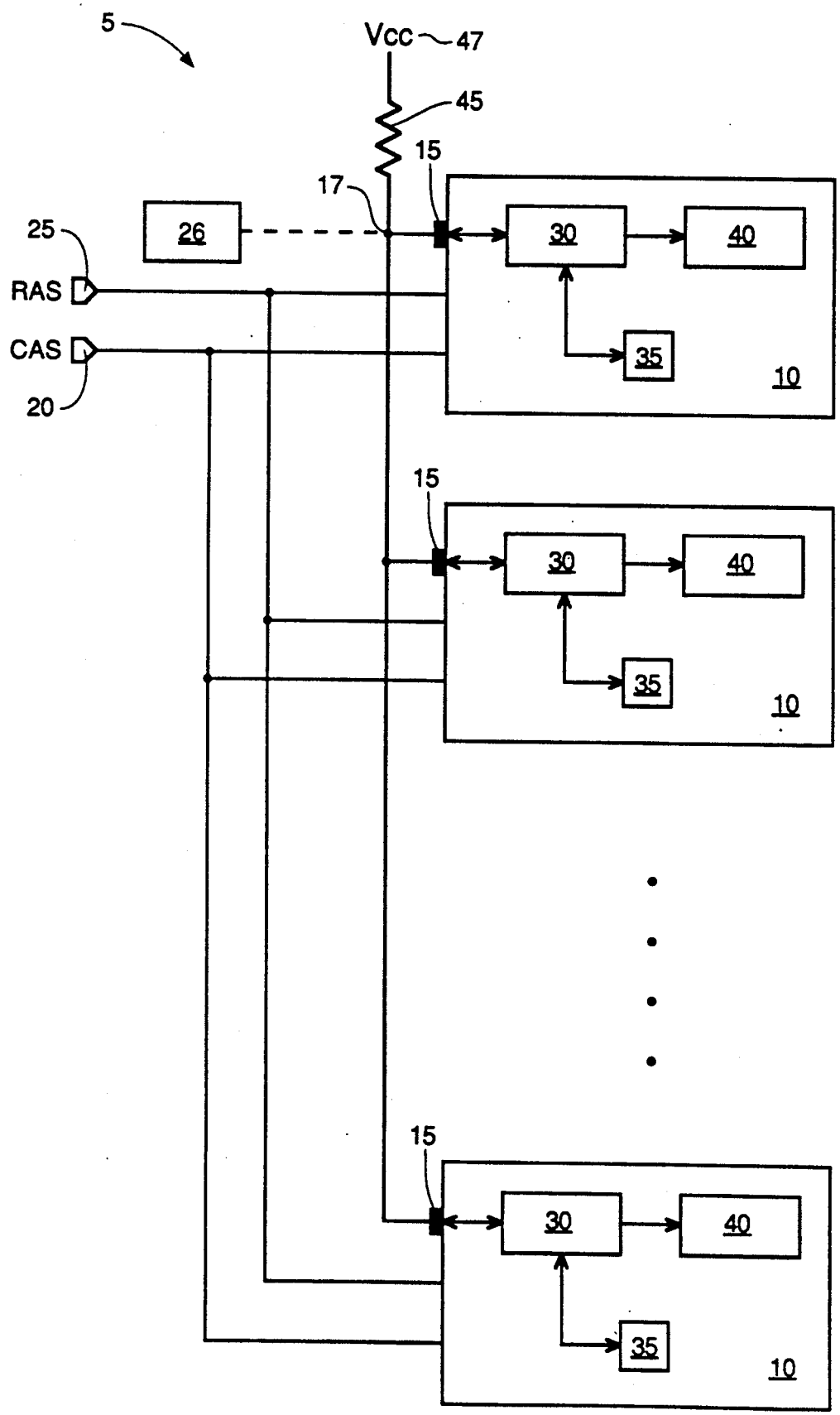
FIG. 1 illustrates a bank of self-refreshing or self-refreshing interruptable DRAMs interconnected to each other at the external refresh pin of each DRAM.

FIG. 1 is representative of a bank 5 of self-refreshing or self-refreshing interruptable DRAMs 10 of first and second embodiments of the present invention. Each self-refreshing DRAM 10 in the bank 5 is connected through internal circuitry to an external refresh pin 15. The refresh pins 15 are connected to each other at an external common node 17. The refresh cycle of the self-refreshing DRAMs 10 is synchronously controlled by the CAS 20 and RAS 25 signals or by the potential on the refresh pins 15.

Alternately, the refresh cycle may be controlled after power up of the system with a signal initiated by the self-refreshing interruptable DRAM 10. In the case of self-refreshing interruptable DRAMs, the common node 17 is connected to the microprocessor 26.

FIG. 1 further illustrates the first and second embodiments with block diagrams of the relevant internal self-refreshing DRAM 10 circuitry. The internal circuitry comprises an arbitration circuit 30, a timing circuit 35 enabled or disabled or reset by the arbitration circuit 30, and a refresh circuit 40 having a refresh cycle initialized or terminated by the arbitration circuit 30.

The first embodiment of the invention is a circuit providing a method in which any self-refreshing interruptable DRAM 10 having an active output signal from its respective timing circuit 35 initiates an instruction to precipitate its refresh cycle and pull its external refresh pin 15 low. Since the refresh pins 15 of each self-refreshing interruptable DRAM 10 are connected at a common node 17 through a wired AND configuration, all refresh pins 15 are pulled low by a low on any individual refresh pin. The arbitration circuits 30 in the remaining DRAMs receive the low from their individual external refresh pins 15 and consequently precipitate a refresh and a reset of their respective timing circuits 35 to ensure that the DRAMs 10 in the bank 5 have synchronous refresh cycles. The low on the refresh pin simultaneously sends a signal to the microprocessor to wait. This method is repeated with the next active output signal from the timing circuit. When no lows are present the refresh pins 15 are pulled high through an external resistor 45 connected serially between the refresh pins 15 and a supply node 47. The supply node is connectable to a supply potential.

In the second embodiment the arbitration circuit 30 pertinent to the self-refreshing DRAM 10 having the fastest timing sequence will pull the corresponding external refresh pin 15 low. Since the refresh pins 15 of each self-refreshing DRAM 10 are connected at a common node 17, all refresh pins 15 are pulled low by a low on any individual refresh pin 15. When no lows are present the refresh pins 15 are pulled high through an external resistor 45 connected serially between the refresh pins 15 and a supply node 47. The supply node is connectable to a supply potential.

The master self-refreshing DRAM initiates an instruction via an active timing circuit output signal. The active timing circuit output signal is routed through its respective arbitration circuit 30 to precipitate a refresh signal to enable the refresh circuitry 40 of the slave self-refreshing DRAMs in the bank and to precipitate arbitration output signals for maintaining the timing sequence in the master self-refreshing DRAM while terminating the timing sequence of the slave self-refreshing DRAMs. Consequently, all but one timing circuit 35 is disabled resulting in a significant power savings; and all of the refresh cycles are synchronized, reducing wait states and thereby increasing the microprocessor speed.

Figure 2:
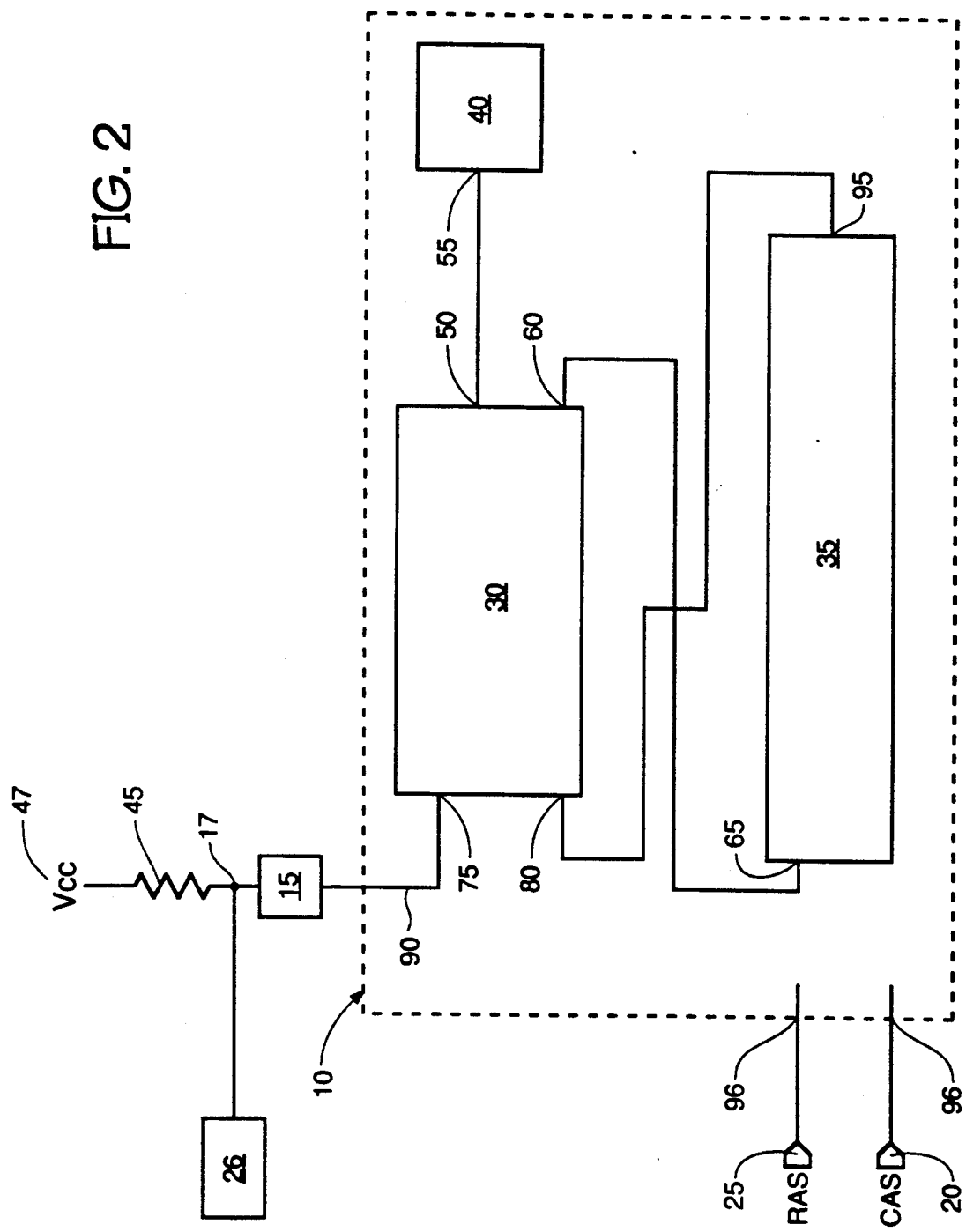
FIG. 2 is a block schematic of refresh synchronizing circuitry of the first embodiment.

The internal circuitry of one self-refreshing interruptable DRAM 10 of the first embodiment is depicted more fully in block diagram format in FIG. 2. The internal circuitry is representative of the internal circuitry of all of the DRAMs 10 in the bank 5. Therefore, the entire bank 5 of DRAMs 10 is referred to intermittently throughout the description with numbers corresponding to FIG. 1. Any numbers pertinent to FIG. 1 are pertinent to the duplicate components in FIG. 2. The arbitration circuit 30 provides a refresh signal at a first output terminal 50 to a refresh input terminal 55 of the refresh circuit 40 and provides an arbitration output signal at a second output terminal 60 to a first timing circuit input terminal 65. The arbitration output signal either has no effect on the timing circuit or provides a reset pulse in order to synchronize the timing sequences of the DRAMs 10 of the bank 5. The arbitration circuit 30 is controlled according to signals received at a first input terminal 75 and a second input terminal 80. The first input terminal 75 is connected to the refresh pin 15 and consequently the common node 17. The first input terminal 75 also serves as an output terminal through the bidirectional control path 90 connecting the internal arbitration circuitry to the refresh pin 15. As an input terminal, the first input terminal 75 either accepts a high supply potential or a low ground potential. The timing circuit 35 provides inactive or active output signals at a timer circuit output terminal 95 to the second input terminal 80 of the arbitration circuit 30. The DRAM receives CAS 20 and RAS 25 at two control input terminals 96.

Figure 3:
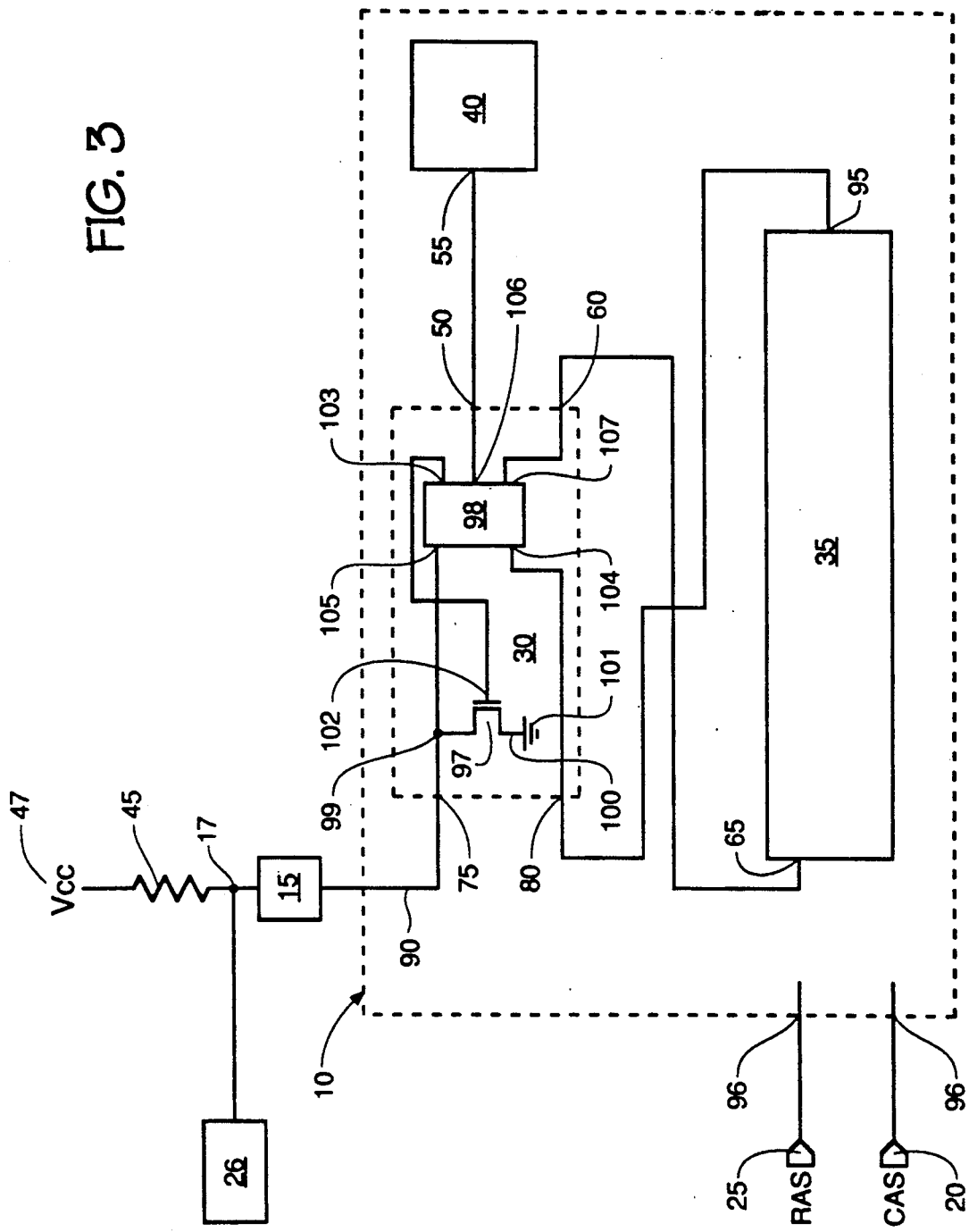
FIG. 3 is a more detailed schematic of the refresh synchronizing circuitry of the first embodiment.

The arbitration circuit 30 is detailed more fully in FIG. 3. Any numbers pertinent to FIGS. 1 and 2 are pertinent to the duplicate components in FIG. 3. The arbitration circuit 30 comprises a control device such as MOSFET 97 and a control circuit 98. The MOSFET 97 is connected in a wired AND configuration to the MOSFETS 97 of the remaining DRAMs 10. The MOSFET drain 99 is connected to the refresh pin 15, the source 100 is connected to a reference node 101 having a ground potential and the gate 102 is connected to a gate output terminal 103 of the control circuit 98. The control circuit 98 receives the inactive and active output signals from the timing circuit 35 at a second control circuit input terminal 104. The control circuit 98 receives a first and second potential from the refresh pin 15 at a first control circuit input terminal 105. The control circuit 98 provides the refresh signal at a first control circuit output terminal 106, the arbitration output signal at a second control circuit output terminal 107, and a gate signal at the gate output terminal 103. When the control circuit 98 receives an active output signal from the timing circuit 35 it initiates a refresh cycle in the refresh circuit 40 with a refresh signal from the first control circuit output terminal 106 and it gates the MOSFET device 97 with a signal from the gate output terminal 103. The gated MOSFET device 97 turns on and pulls the refresh pin 15 low. The refresh pin 15 then pulls the other refresh pins 15 of the bank 5 low through the activated MOSFET device 97. The low on the refresh pins 15 is felt at the first control circuit input terminal 109 of the remaining control circuits 98 in the bank 5. The remaining control circuits 98 convert the low input signal to provide a reset signal to the respective timing circuits 35 and to initiate a refresh signal to activate the refresh cycles in the DRAMs 10 of the bank 5. The low on the refresh pin 15 is also felt at the microprocessor 26 which puts the microprocessor 26 into a wait state. The reset signal synchronizes the timing sequences of the DRAMs 10 in the bank 5. The synchronized timing sequences significantly increases the computer speed by reducing the number of wait states. Power consumption is also reduced.

Alternately, the refresh pin 15 can be passively pulled to the supply potential 47 through any passive device such as a diode or a transistor, wherein the transistor is configured as either a resistor or a diode. The control device may also comprise a bipolar transistor or another field effect transistor configuration.

Figure 4:
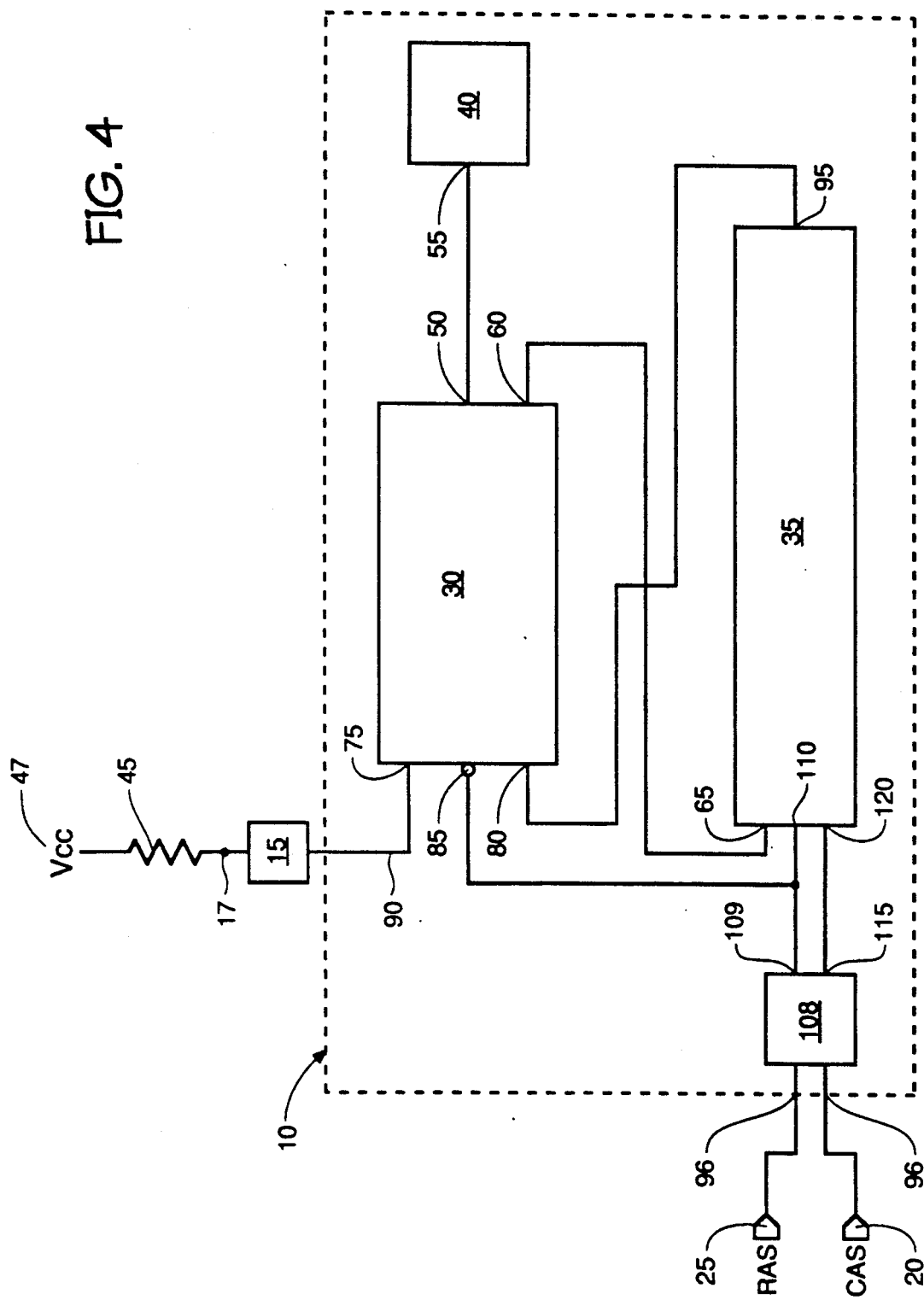
FIG. 4 is a block schematic of refresh synchronizing circuitry of the second embodiment.
Figure 5:
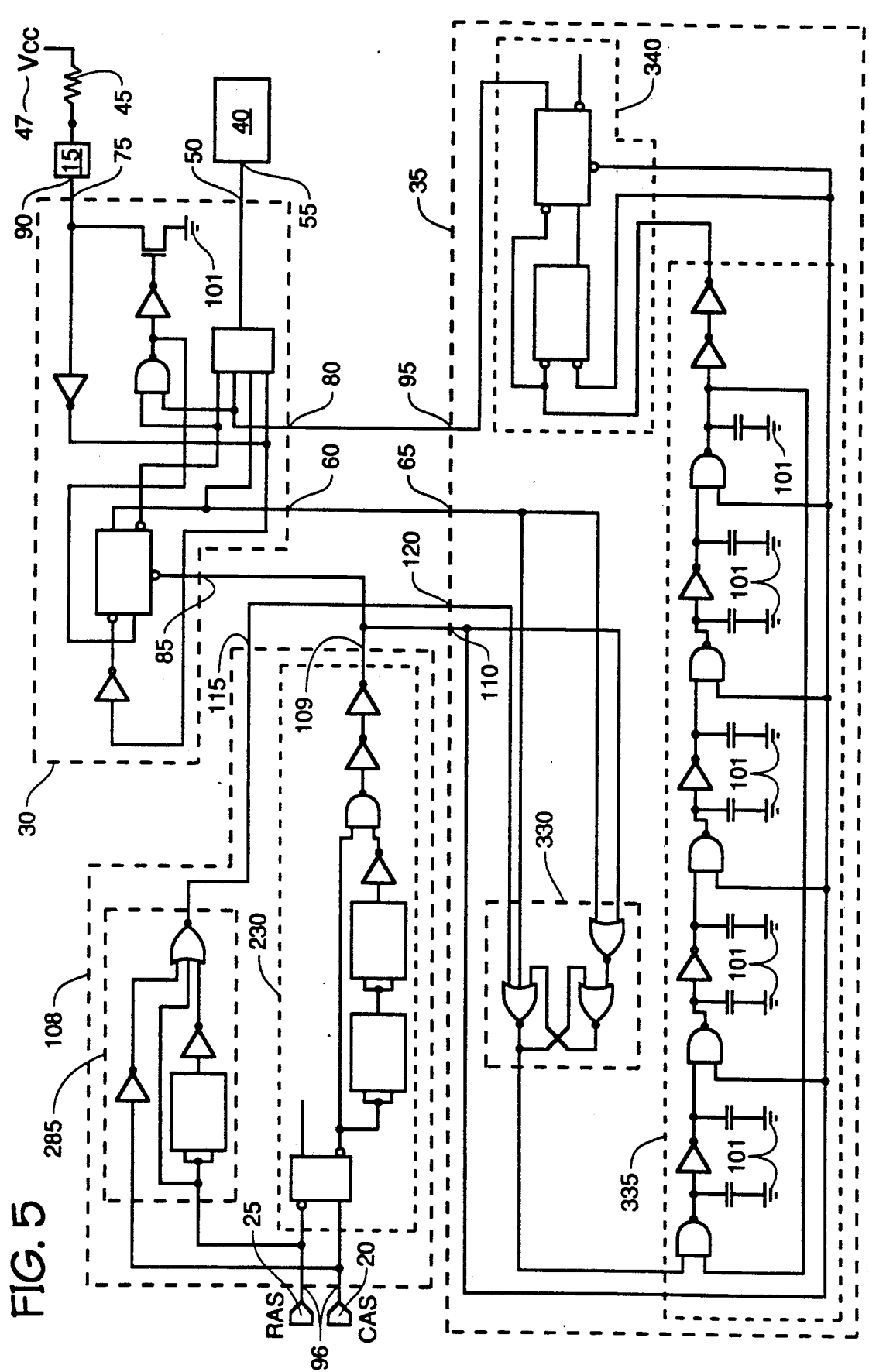
FIG. 5 is a detailed schematic of the refresh synchronizing circuitry of the second embodiment.
Figure 6:
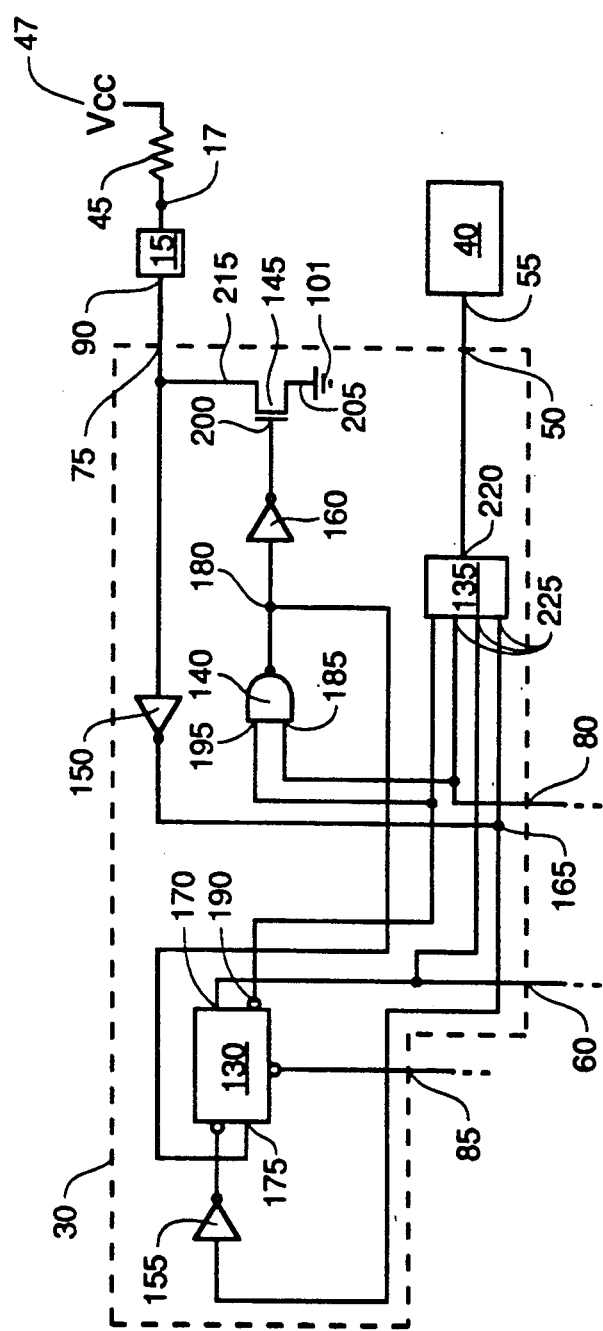
FIGS. 6, 7 and 8 are subsections of FIG. 3.

The internal circuitry of one self-refreshing DRAM 10 of a second preferred embodiment of the present invention is depicted more fully in block diagram format in FIG. 4. Therefore, any numbers pertinent to FIG. 1 are pertinent to the duplicate components in FIG. 4. The arbitration circuit 30 provides a refresh signal at a first output terminal 50 to a refresh input terminal 55 of the refresh circuit 40 and provides an arbitration output signal at a second output terminal 60 to a first timing circuit input terminal 65 to initiate, maintain or terminate the timing sequence of the timing circuit 35. The arbitration output signal is either an oscillator enable signal or an oscillator disable signal. The arbitration circuit 30 is controlled according to signals received at a first input terminal 75, a second input terminal 80 and a reset input terminal 85. The first input terminal 75 is connected to the refresh pin 15 and consequently the common node 17. The first input terminal 75 also serves as an output terminal through the bidirectional control path 90 connecting the internal arbitration circuitry to the refresh pin 15. As an input terminal, the first input terminal 75 either accepts a high supply potential or a low ground potential. In the case of the master self-refreshing DRAM, the first input terminal 75 serves as an output terminal, going low and pulling the refresh pins 15 of the slave self-refreshing DRAMs low. The timing circuit 35 provides inactive or active output signals at a timer circuit output terminal 95 to the second input terminal 80 of the arbitration circuit 30. The master self-refreshing DRAM has an active output signal and the slave self-refreshing DRAMs have inactive output signals at the timing circuit output terminal 95.

The arbitration circuit 30 and the timing circuit 35 are enabled with a constant potential from a start/stop circuit 108. The start/stop circuit 108 can either initiate a timing sequence or terminate a timing sequence. The arbitration circuit 30 receives either a low reset pulse telling it to initiate an initial timing sequence or a high first timing enable signal from a first control output terminal 109 of the start/stop circuit 108 at the reset input terminal 85. The first control output terminal 109 is also connected to a second timing circuit input terminal 110. Both the arbitration circuit 30 and the timing circuit 35 are reset by the low reset pulse and are enabled by the first timing enable signal. Resetting the arbitration circuit 30 results in an initial synchronized timing sequence in all self-refreshing DRAMs in the bank.

A second control output terminal 115 of the start/stop circuit 108 is connected to a third timing circuit input terminal 120. A low on the second timing circuit input terminal 120 enables the timing circuit 35, and a high stop pulse at the second timing circuit input terminal 120 terminates the timing sequence.

The start/stop circuit 108 receives CAS 20 and RAS 25 at two control input terminals 96.

The block diagram of FIG. 4 is schematically detailed in FIGS. 5 through 8. The arbitration circuit 30 is primarily shown in FIG. 6 and comprises a D flip flop 130, a multiplexer 135, a two input NAND gate 140, a MOSFET 145, and three inverters 150, 155, and 160, two (150 and 155) of which are connected at a serial connection 165. The inactive or active output signal from the timing circuit 35 is fed back as an oscillator disable or an oscillator enable signal respectively to the first timing circuit input terminal 65 from the Q output terminal 170 of the D flip flop 130 after being clocked into the D input terminal 175 from the NAND gate output terminal 180. The timing circuit output terminal 95 connected to the second input terminal 185 of NAND gate 140 and the Q complement output terminal 190 of the D flip flop 130 is connected to the first input terminal 195 of NAND gate 140. In the case of the slave self-refreshing DRAM, the first input terminal 195 of NAND gate 140 ensures that the arbitration output signal is an oscillator disable signal even though the timing circuit output terminal 95 may have an active output signal subsequent to the master self-refreshing DRAM active output signal.

The NAND gate output terminal 180 is connected to the gate 200 of the MOSFET device 145 through inverter 160. The source 205 of the MOSFET 145 is connected to the reference node 101 and the drain 215 is connected to the refresh pin 15. The refresh pin 15 is connected to the supply node 47 through a serially connected external resistor 45. A low on the NAND gate output terminal 180 is inverted to bias the gate 200 and pull the refresh pin 15 low. The low on the refresh pin 15 is doubly inverted to clock the signal at the NAND gate output terminal 180 to the Q output terminal 170. Therefore, a high active output signal from the timing circuit 35 will pull the corresponding refresh pin 15 low and clock a low at the NAND gate output terminal 180 through the D flip flop 130 to maintain the timing sequence in the master self-refreshing DRAM. The refresh pins 15 of the slave self-refreshing DRAMs are pulled low by the refresh pin 15 of the master self-refreshing DRAM clocking a high at the NAND gate output terminal 180 through the D flip flop 130 to disable the timing sequence in the slave self-refreshing DRAMs.

Alternately, the refresh pin 15 can be passively pulled to the supply potential 47 through any passive device such as a diode or a transistor, wherein the transistor is configured as either a resistor or a diode. The MOSFET 145 may also be replaced with an alternate control device comprising a bipolar transistor or an field effect transistor configuration.

The multiplexer output terminal 220 is the first output terminal 50 of the arbitration circuit 30 and initiates and terminates the refresh cycle in the refresh circuit 40. The multiplexer 135 has four input terminals 225; the timing circuit output terminal 95, Q 170, Q complement 190 and the serial connection 165, the potential of the refresh pin 15 inverted at the serial connection 165. A refresh signal at the multiplexer output terminal 220 initiates a refresh cycle with either a high active output signal from the timing circuit 35 and a high Q complement 190 or a low inactive output signal from the timing circuit 35 and a high at the serial connection 165.

Figure 7:
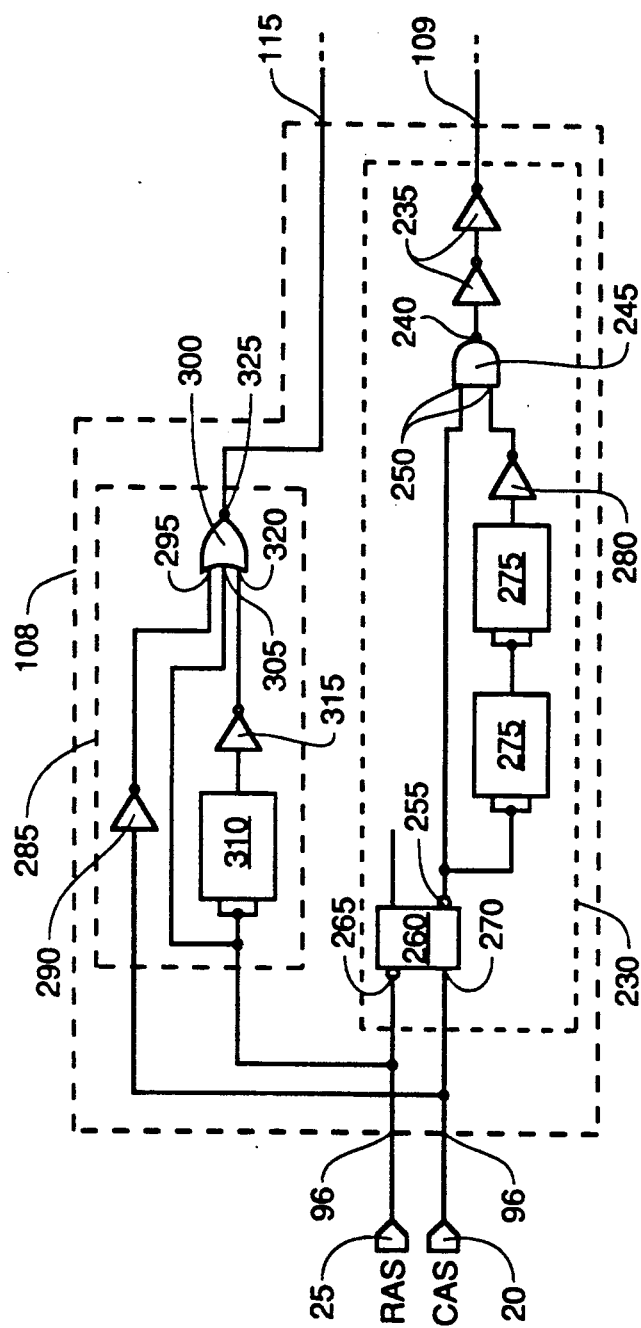

The start/stop circuit 108 is primarily shown in FIG. 7 and has a normally high first timing enable signal and a normally low second timing enable signal at first 109 and second 115 control output terminals respectively to provide enable signals to the timing circuit 35. First and second external input signals are felt at control input terminals 96 of the start/stop circuit 108. RAS 25 is a first external input signal to the start/stop circuit 108 while CAS 20 is a second external input signal. CAS 20 asserted low while RAS 25 remains high functions as a first control signal to provide a low pulse at the first control output terminal 109 of a start 230 portion of the start/stop circuit 108. The low pulse is driven through serially connected double inverters 235 from the output terminal 240 of a two input NAND gate 245. The input terminals 250 of said NAND gate 245 are inverted one from the other. The input terminals 250 originate at a Q complement output terminal 255 of a start circuit D flip flop 260, RAS 25 being the clock input terminal 265 and CAS 20 being the D input terminal 270 of the D flip flop 260. Two timing delay devices 275 in series with an inverter 280 result in momentary highs at both NAND gate input terminals 250 in response to the first control signal to produce the low output pulse in what is otherwise a normally high NAND gate output signal. An appropriate timing delay device may comprise connecting two inverters at a serial connection and connecting a capacitor from the serial connection to ground.

RAS 25 asserted low while CAS 20 remains high functions as a second control signal to provide a high pulse at the second control output terminal 115 of a stop portion 285 of the start/stop circuit 108. CAS 20 is inverted through an inverter 290 to the first input terminal 295 of a three input NOR gate 300. RAS 25 is the second input terminal 305 of the NOR gate 300 and RAS 25 is driven through a serially connected timing delay device 310 and an inverter 315 to the third input terminal 320 of the NOR gate 300. The second control signal provides a momentary simultaneous low on all three NOR gate input terminals resulting in a high pulse at the output terminal 325 of the NOR gate 300 in what is otherwise a normally low NOR gate output signal. The NOR gate output terminal 325 is the second control output terminal 115 of the start/stop circuit 108 and is connected to the third timing circuit input terminal 120. A high output pulse at the second control output terminal 115 terminates the timing sequence of the timing circuit 35.

Figure 8:
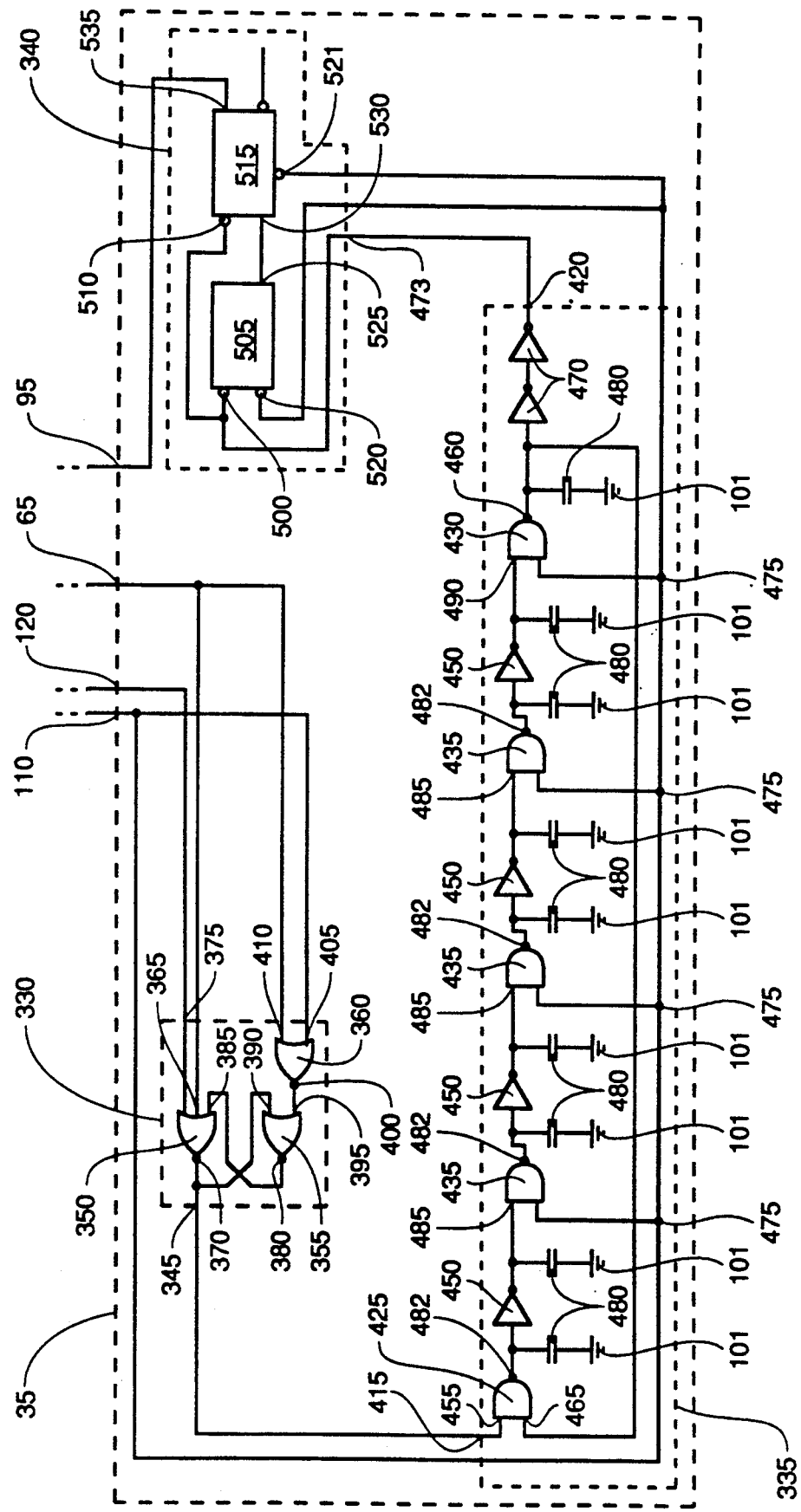

The timing circuit 35 is primarily shown in FIG. 8 and is comprised of an oscillator enable circuit 330, a synchronized oscillator 335 and a timer 340. The oscillator enable circuit 330 has an enable output terminal 345 and receives enabling, initiating, terminating and maintaining signals at the first 65, second 110 and third 120 timing circuit input terminals. The oscillator enable circuit 330 is a latch comprising a first NOR gate 350 having three input terminals and a second 355 and a third 360 NOR gate each having two input terminals. The enable output terminal 345 is the output terminal of the first NOR gate 350. The arbitration output signal is latched through the second input terminal 365 of the first NOR gate 350 to the output terminal 370 of the first NOR gate 350, said second input terminal 365 connected to the second output terminal 60 of the arbitration circuit 30. The first NOR gate 350 is connected to the second control output terminal 115 at its first input terminal 375 and is connected to the output terminal 380 of the second NOR gate 355 at its third input terminal 385. The output terminal 370 of the first NOR gate 350 is the first input terminal 390 of the second NOR gate 355. The second input terminal 395 of the second NOR gate 355 is the output terminal 400 of the third NOR gate 360. The second input terminal 405 of the third NOR gate 360 is connected to the first control output terminal 109, and the first input terminal 410 is connected to the second output terminal 60 of the arbitration circuit 30.

The synchronized oscillator 335 receives a start signal from the enable output terminal 345 at an oscillator input terminal 415 and provides a pulsating voltage at an oscillator output terminal 420 to the timer circuit 340. The circuitry of the synchronized oscillator 335 and timer 340 determines the periodic refresh rate of the refresh cycle. In the second embodiment the synchronized oscillator 335 is comprised of a first 425, a last 430, and three coupling NAND gates 435 serially connected through inverters 450 from the output terminal of the preceding NAND gate to a first input terminal of the successive NAND gate with the exception of the first 425 and last 430 NAND gates. Each individual NAND gate and inverter is referred to as an oscillator stage. The first input terminal 455 of the first NAND gate 425 is connected to the enable output terminal 345, and the last NAND gate output terminal 460 feeds back as a second input terminal 465 to the first NAND gate 425 to provide a signal to eventually invert the signal at the oscillator output terminal 420. The output signal of the last NAND gate 430 is inverted through double inverters 470 to a timer input terminal 473. The second input terminals 475 of the coupling NAND gates 435 and the last NAND gate 430 are connected to the first control output terminal 109 in order to ensure the rapid synchronization of the synchronous oscillator with the timer concurrent to the generation of the reset pulse. Since in this configuration the reset pulse simultaneously resets these four NAND gate stages, the oscillator is synchronized four and one-half times more rapidly than if a single reset input signal was utilized to synchronize the oscillator. In the latter case the reset signal would have to propagate through nine stages. Capacitors 480 are connected between the output terminals 482 and 460 of each NAND gate 455, 435 and 430 and reference node 101, and between the first input terminals 485 of the coupling NAND gates 435 and reference node 101, and between the first input terminal 490 of the last NAND gate 430 and reference node 101. The capacitors 480 decrease the frequency of the pulsating voltage.

The pulsating voltage from the oscillator output terminal 420 is received at the timer input terminal 473 and directed to both a counter input terminal 500 of a counter circuit 505 and a clock input terminal 510 of a timer circuit D flip flop 515. The counter 505 and D flip flop 515 are connected to the first control output terminal 109 at a reset enable input terminal 520 and a flip flop reset 521, respectively. The counter 505 decreases the frequency of the pulsating voltage at the ripple carry output terminal 525 which is connected to the D input terminal 530 of the D flip flop 515. The potential at the D input terminal 530 is clocked to the timer circuit output terminal 95 which is the D flip flop Q output terminal 535 by the pulsating voltage to provide active and inactive output signals to the arbitration circuit 30.

Care must be taken in the circuit design to ensure that the refresh system does not fail due to timing race conditions resulting when two oscillators have similar frequencies. The worst case scenario occurs when all devices go into slave mode and there is no master. This results in no refresh cycles and the loss of the memory contents. In order to ensure that two similar oscillator frequencies will not cause a system failure, a fail-safe technique may be employed in the design to guarantee that the self-refreshing DRAM defaults to a master under close timing conditions. This fail-safe condition is provided by standard circuit design techniques such as biasing in the arbitration circuit D flip flop 130 or providing a hysteresis arbitration circuit D flip flop 130. With these design techniques, it will be possible to have more than one master DRAM for a short period of time. This situation will not cause a failure and is explained below.

Synchronization of the timing sequence of all self-refreshing DRAMs at the beginning of the power down mode is essential to ensure that the self-refreshing DRAM having the fastest timing sequence functions as the master self-refreshing DRAM. Nonsynchronization may result in an incorrect master self-refreshing DRAM simply because its oscillator or counter started at a different state than the other self-refreshing DRAMs. Synchronization is accomplished by simultaneously resetting the counter 505, the coupling NAND gates 435, the last NAND gate 430, the timer circuit D flip flop 515 and the oscillator enable circuit 330. Therefore, the arbitration circuit 30, start/stop circuit 108 and timing circuit 35 work in combination to provide a means for synchronously initializing at least the first initial timing sequence in the plurality of DRAM devices.

In order for the refresh system to be fail-safe for similar oscillator frequencies, the synchronized oscillators must only be synchronized at the beginning of the power down mode and not after every refresh cycle. In this manner, the infinitesimal time difference between refresh cycles due to differences in propagation delay times is multiplied by the number of refresh cycles until one refresh cycle eventually occurs measurably later than the other refresh cycle. This allows the self-refreshing DRAM having the slowest timing sequence to enter the slave mode.

As an example, assume that the period of the timing sequence of a first self-refreshing DRAM is 1.0 nanosecond (ns) faster than a slower self-refreshing DRAM. Also assume that there is a system propagation delay due to circuit board parasitics that delays the refresh signal from the first self-refreshing DRAM to the slower self-refreshing DRAM by 4.5 ns. Although the first self-refreshing DRAM times out 1.0 ns earlier on the first cycle, the refresh signal does not reach the slower self-refreshing DRAM until 3.5 ns after it has performed its refresh. Therefore, both self-refreshing DRAMs assume the master mode. This operation will continue until the fifth cycle when the first self-refreshing DRAM times out 5.0 ns earlier than the slower self-refreshing DRAM (5.0 times 1.0 ns). The refresh signal reaches the slower self-refreshing DRAM 0.5 ns before its refresh signal is generated. Thus, the slower self-refreshing DRAM now enters the slave mode. This concept can be extended to all self-refreshing DRAMs in the system having similar timing sequences and acting as masters. However, the slower self-refreshing DRAMs continue to turn into slaves until there is only one master, thus low system power dissipation is achieved.

Many different circuit implementations can be used for this invention, and the actual implementation is not critical to the concept. The value of voltage supplies may also be reversed with different circuit implementations. Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A method for operating a memory system having a plurality of memory devices, each memory device having at least one refresh circuit and an external refresh pin, said refresh pins of said plurality of DRAMs connected at a common node, comprising the following steps:
   a) providing said refresh pins alternately with first and second potentials, said first and second potentials having substantially different voltage levels, said first potential provided from a source external to said plurality of said memory devices, and said second potential generated in at least one of said memory devices;
   b) communicating said second potential to said refresh pins from said at least one of said memory devices; and
   c) synchronously refreshing said plurality of memory devices with at least one of said refresh circuits of said plurality of said memory devices in response to said step of providing said second potential on said refresh pins.

2. The method of claim 1, wherein the method further comprises the step of synchronizing timing sequences in a timing circuit internal to each of said memory devices in response to providing said second potential on said refresh pins.

3. The method of claim 1, further comprising the step of passively pulling said refresh pins to said first potential.

4. The method of claim 2, wherein the method further comprises the step of using an arbitration circuit internal to at least one of said memory devices to synchronize refresh cycles of each of said refresh circuits of the memory devices and to synchronize said timing sequences in response to said second potential.

5. A method for refreshing a plurality of memory devices, each memory device having a refresh circuit, a timing circuit, at least one internal control device, and an external refresh pin, said refresh pins of said plurality of memory devices connected at a common node, said refresh pins for alternately receiving a first and a second potential, said first and second potentials having substantially different voltage levels, comprising the following steps:
   a) initiating a timing sequence in said timing circuits of said plurality of memory devices to provide an active timing signal at a timing circuit output terminal in at least one of said memory devices;
   b) activating at least one of said internal control devices in response to said active timing signal to pull said refresh pins of said plurality of memory devices to said second potential;
   c) resetting said timing circuits of said plurality of memory devices in response to said second potential on said refresh pins; and
   d) providing a refresh signal in response to said second potential on said refresh pins to initiate synchronous refresh cycles in said refresh circuits of said plurality of memory devices; and
   e) refreshing said plurality of memory devices during said synchronous refresh cycles.

6. The method of claim 5, further comprising the following steps:

7. The method of claim 5, wherein said step of activating said at least one of said internal control devices further comprises the following steps:
   a) interposing said internal control device between said refresh pin and a reference node, said reference node connectable to said second potential; and
   b) activating said at least one of said control devices thereby pulling a corresponding one of said refresh pins to a same potential as said reference node.

8. The method of claim 5, further comprising the following steps:
   a) communicating said first and second potentials to a microprocessor, from said common node; and
   b) placing said microprocessor in a wait state in response to said microprocessor receiving said second potential from said refresh pin.

9. A method for operating a memory system, comprising the following steps:
   a) providing bi-directional electrical communication, at a common node, between a plurality of memory devices;
   b) generating a refresh message at said common node, said step of generating performed by one of said memory devices of said plurality; and
   c) synchronously refreshing said memory devices of said plurality in response to said refresh message, said synchronously refreshing performed by an internal refresh circuit of at least one of said memory devices.

10. The method as specified in claim 9, further comprising the step of preserving a memory of said memory system during said step of synchronously refreshing.

11. The method as specified in claim 9, wherein said step of synchronously refreshing further comprises synchronously activating refresh circuitry in each memory device of said plurality.

12. The method as specified in claim 9, further comprising deactivating refresh circuitry, in each of said memory devices of said plurality subsequent to said step of synchronously refreshing by passively pulling said common node to a supply potential.

13. The method as specified in claim 9, further comprising the step of determining a timing rate for performing said step of synchronously refreshing.

14. The method as specified in claim 13, further comprising the following steps:
   a) specifying a row on which to perform said step of synchronously refreshing during said step of determining said timing rate; and
   b) incrementing a row address for a subsequent step of refreshing during said step of determining said timing rate.

15. The method as specified in claim 9, wherein said step of generating further comprises the following steps:
   a) generating a timing sequence;
   b) terminating said timing sequence;
   c) activating a control device in response to said step of terminating; and
   d) pulling said common node to a reference potential through said activated control device, said refresh message being said reference potential.

16. The method as specified in claim 9, further comprising the step of determining a master memory device of said plurality of memory devices, said master memory device having a fastest timing sequence for determining a rate for performing said step of synchronously refreshing.

17. The method as specified in claim 16, wherein said step of generating, further comprises communicating said refresh message from said master memory device to said common node.

18. The method as specified in claim 16, further comprising the step of periodically performing said step of synchronously refreshing according to said timing sequence of said master memory device.

19. The method as specified in claim 16, further comprising the step of deactivating timing circuits of said memory devices having a timing sequence less than said timing sequence of said master memory device in response to said refresh message on said common node, said timing circuit of said master memory device thereby controlling said step of generating said refresh message.

20. The method as specified in claim 9, further comprising the step of interrupting a memory operation of said memory system only once per a row refresh.

21. A method of operating a bank of memory devices, comprising the following steps:
   a) providing electrical interaction between all of the memory devices of the bank;
   b) generating a refresh signal in one memory device of the bank;
   c) communicating said refresh signal to said memory device performing said step of generating;
   d) communicating said refresh signal to remaining memory devices of the bank; and
   e) synchronously refreshing all of the memory devices in the bank in response to said refresh signal.

22. The method as specified in claim 21, further comprising the step of refreshing all of said memory devices of the bank with a refresh circuit of said one memory device performing said step of generating.

23. The method as specified in claim 21, further comprising the step of refreshing each memory device of the bank with a refresh circuit integral to each said memory device.

24. A method of operating a memory system, comprising the following steps:
   a) activating an internal refresh circuit of a first memory device;
   b) refreshing said first memory device with said internal refresh circuit;
   c) providing an electrical interaction between said first memory device and a second memory device; and
   d) refreshing said second memory device in response to said internal refresh circuit; and wherein said step so refreshing said first and second memory devices are performed synchronously.

25. The method as specified in claim 24, further comprising the step of disabling an internal refresh circuit of said second memory device during said step of refreshing said second memory device.

26. The method as specified in claim 24, further comprising the step of activating an internal refresh circuit of said second memory device to perform said step of refreshing said second memory device.

27. The method as specified in claim 24, further comprising the following steps:
   a) initializing a timing sequence in a timing circuit of said first memory device;
   b) initializing a timing sequence in a timing circuit of said second memory device; and
   c) generating a refresh signal at the termination of said timing sequence of said first memory device, said steps of refreshing performed in response to said refresh signal.

28. The method as specified in claim 27, further comprising the step of disabling said timing circuit in said second memory device.

29. A method for refreshing a plurality of self-refreshing DRAMs, comprising the following steps:
   a) pulling an external refresh pin of each of the self-refreshing DRAMs of the plurality to a first potential prior to performing the refreshing;
   b) generating an active timing circuit output signal in one of the self-refreshing DRAMs of the plurality;
   c) driving said external refresh pin of the self-refreshing DRAM having said active timing circuit output signal to a second potential in response to said active timing circuit output signal;
   d) driving all of said external refresh pins of the self-refreshing DRAMs of the plurality to said second potential in response to said second potential on said external refresh pin of the self-refreshing DRAM having said active timing circuit output signal; and
   e) synchronously refreshing a row of memory cells in each of said self-refreshing DRAMs of said plurality in response to said second potential on said external refresh pins, said step of synchronously refreshing performed by at least one refresh circuit in at least one of said self-refreshing DRAMs of said plurality.

30. The method as specified in claim 29, wherein said step of synchronously refreshing comprises the following steps:
   a) synchronously initializing a timing sequence in a timing circuit in each of the self-refreshing DRAMs of the plurality;
   b) generating an active refresh signal in said timing circuit in each of the self-refreshing DRAMs of the plurality; and
   c) activating a refresh circuit in each of said self-refreshing DRAMs of said plurality in response to a corresponding said active refresh signal.

31. The method as specified in claim 29, wherein said step of generating said active timing circuit output signal comprises the following steps:
   a) synchronously initializing an oscillator in each of the self-refreshing DRAMs of the plurality; and
   b) determining a fastest oscillator, the self-refreshing DRAM having said fastest oscillator called a master DRAM, the self-refreshing DRAMs of the plurality having a slower oscillator than said fastest oscillator called slave DRAMs, said active timing circuit output signal generated in said master DRAM.

32. The method as specified in claim 31, further comprising the step of disabling all of said oscillators of said slave DRAMs.

33. The method as specified in claim 29, further comprising signaling a microprocessor to wait during said step of refreshing in response to said second potential on said external refresh pins.

34. The method as specified in claim 29, further comprising the step of electrically disengaging said self-refreshing DRAMs from external circuitry during said step of synchronously refreshing in response to said second potential on said external refresh pins.

35. A method for refreshing a bank of self-refreshing DRAMs, comprising the following steps:
 a) generating an active refresh signal in one of the self-refreshing DRAMs of the bank;
 b) communicating said active refresh signal from said one of the self-refreshing DRAMs of the bank to remaining said self-refreshing DRAMs of the bank;
 p1 c) synchronously refreshing a row of memory storage cells in each of the self-refreshing DRAMs of the bank in response to said refresh signal, said step of synchronously refreshing performed by at least one refresh circuit in at least one of said self-refreshing DRAMs of said bank; and
 d) interrupting a microprocessor during said step of refreshing.

36. The method as specified in claim 35, wherein said step of interrupting is performed in response to said refresh signal.

37. A method for refreshing a bank of DRAMs comprising the following steps:
 a) generating an active reset signal at an external node, said active reset signal generated in one of said DRAMs of said bank;
 b) communicating said reset signal to all of said DRAMs in said bank;
 c) resetting a timing circuit in each of said DRAMs in said bank in response to said active reset signal;
 d) generating a refresh signal in each of said timing circuits;
 e) activating a refresh circuit in each of said DRAMs of said bank in response to said refresh signal; and
 f) synchronously refreshing each of said DRAMs of said bank with an activated said refresh circuit.

38. The method as specified in claim 37, further comprising the step of forcing a microprocessor to wait during said step of synchronously refreshing in response to said active reset signal.

39. The method as specified in claim 37, further comprising the step of disengaging external circuitry from said DRAMs of said bank in response to said active reset signal.

40. A method for reducing wait states and increasing microprocessor speed in a memory device comprising a plurality of self-refreshing DRAMs, comprising the following steps:
 a) initializing a timing sequence in each of the self-refreshing DRAMs of the plurality;
 b) generating a reset signal in one of said self-refreshing DRAMs of said plurality at a conclusion of at least one of said timing sequences;
 c) synchronously refreshing all of the self-refreshing DRAMs of the plurality in response to said reset signal; and
 d) initiating a wait state in said microprocessor during said step of synchronously refreshing.

41. The method as specified in claim 40, further comprising the following steps:
 a) resetting a plurality of timing circuits, each one of the self-refreshing DRAMs of the plurality having one of said timing circuits of said plurality of timing circuits, in response to said reset signal; and
 b) refreshing each of the self-refreshing DRAMs in response to an active output signal of a corresponding one of said timing circuits.

42. The method as specified in claim 40, further comprising the following steps:
 a) maintaining said timing sequence in one of the self-refreshing DRAMs having a fastest timing sequence;
 b) terminating said timing sequence int eh self-refreshing DRAms having a timing sequence slower than said fastest timing sequence;
 c) generating a refresh signal in said self-refreshing Dram having said fastest timing sequence; and
 d) synchronously refreshing all of said self-refreshing DRAMs of said plurality in response to said refresh signal.

43. The method as specified in claim 40, wherein said step of initiating is performed in response to said reset signal.

* * * * *